US010288355B2

(12) United States Patent
Mulinti et al.

(10) Patent No.: US 10,288,355 B2
(45) Date of Patent: May 14, 2019

(54) HEAT EXCHANGER ASSEMBLIES AND METHODS FOR COOLING THE INTERIOR OF AN ENCLOSURE

(71) Applicant: Noren Products Inc., Taylor, TX (US)

(72) Inventors: Rahul Mulinti, Pflugerville, TX (US); Sasi Beera, Fremont, CA (US); Dennis Galindo, Taylor, TX (US); Sanchan Modi, Round Rock, TX (US)

(73) Assignee: Noren Products Inc., Taylor, TX (US)

( * ) Notice: Subject to any disclaimer, the term of this patent is extended or adjusted under 35 U.S.C. 154(b) by 0 days.

(21) Appl. No.: 15/642,209

(22) Filed: Jul. 5, 2017

(65) Prior Publication Data

US 2019/0011194 A1    Jan. 10, 2019

(51) Int. Cl.
| | | |
|---|---|---|
| *F24H 3/06* | (2006.01) |
| *F28F 13/12* | (2006.01) |
| *F28D 9/00* | (2006.01) |
| *F28F 3/02* | (2006.01) |

(52) U.S. Cl.
CPC ............. *F28D 9/0081* (2013.01); *F28F 3/02* (2013.01); *F28F 3/022* (2013.01); *F28F 2250/08* (2013.01)

(58) Field of Classification Search
CPC .......... F28F 3/02; F28F 3/022; F28F 2250/08; F25B 21/02; F28D 9/0081; A01N 1/02
USPC ........................................................ 165/122
See application file for complete search history.

(56) References Cited

U.S. PATENT DOCUMENTS

| | | | |
|---|---|---|---|
| 3,823,567 A * | 7/1974 | Corini | F25B 21/02 62/268 |
| 4,706,739 A | 11/1987 | Noren | |
| 4,907,644 A | 3/1990 | Ghiraldi | |
| 5,217,064 A * | 6/1993 | Kellow | A61J 1/165 165/254 |
| 5,297,005 A | 3/1994 | Gourdine | |
| 5,311,928 A | 5/1994 | Marton | |
| 5,398,510 A * | 3/1995 | Gilley | F25B 21/02 62/3.2 |
| 5,406,451 A | 4/1995 | Korinsky | |
| 5,579,830 A | 12/1996 | Giammaruti | |
| 5,748,445 A | 5/1998 | North et al. | |

(Continued)

OTHER PUBLICATIONS

Dawn, "Reduce Electronic Waste Heat Without Breaking the Budget", Tech Trends, IMPO, Apr. 2013, pp. 22-23.

(Continued)

*Primary Examiner* — Davis D Hwu
(74) *Attorney, Agent, or Firm* — Kilpatrick Townsend & Stockton LLP

(57) ABSTRACT

Heat exchanger assemblies and methods are provided for cooling the interior of an enclosure (e.g., electrical cabinets, computer server racks, chemical chambers, and animal cages). Heat is transferred via thermal conduction from a first plurality of surfaces positioned inside the enclosure to a second plurality of surfaces positioned outside the enclosure. The first and second plurality of surfaces remain in thermal contact with one another during use. Heat is dissipated from the second plurality of surfaces to the ambient air outside the isolated environment without the ambient outside air mixing together with the air inside the enclosure. This, in turn, inexpensively removes heat from the air inside the enclosure and prevents contaminants from entering the enclosure.

18 Claims, 11 Drawing Sheets

(56) References Cited

U.S. PATENT DOCUMENTS

| | | | |
|---|---|---|---|
| 6,105,875 | A | 8/2000 | LaGrotta et al. |
| 6,131,647 | A | 10/2000 | Suzuki et al. |
| 6,196,003 | B1 | 3/2001 | Macias et al. |
| 6,260,360 | B1 * | 7/2001 | Wheeler .................. A01N 1/02 62/3.6 |
| 6,301,779 | B1 | 10/2001 | Azar |
| 6,611,428 | B1 | 8/2003 | Wong |
| 7,342,789 | B2 | 3/2008 | Hall et al. |
| 7,436,660 | B2 | 10/2008 | Pedoeem et al. |
| 7,650,932 | B2 | 1/2010 | Li |
| 7,654,310 | B2 | 2/2010 | Li |
| 7,957,132 | B2 | 6/2011 | Fried |
| 2011/0267776 | A1 | 11/2011 | Porreca et al. |
| 2015/0075184 | A1 | 3/2015 | Edwards et al. |

OTHER PUBLICATIONS

Lienhard., et al., A Heat Transfer Textbook, 4th Edition, Phlogiston Press, Cambridge Massachusetts, Version 2.12, Jul. 15, 2018, pp. 6-10, 99-129 and 141-184.

* cited by examiner

HEAT EXCHANGER ASSEMBLIES AND METHODS FOR COOLING THE INTERIOR OF AN ENCLOSURE

BACKGROUND OF THE INVENTION

Many activities release thermal energy (i.e., heat). Examples include mechanical (e.g., friction), chemical (e.g., exothermic reactions), biological (e.g., endothermic organisms), and electrical activities (e.g. electronic components). When heat is generated in a closed environ, it presents unique challenges when cooling is desired inside the enclosure. Such challenges extend to include many sizes of closed environments including sealed cabinets, closets and even secured rooms, for example.

Over-heating of computer components due to the heat generated by electrical equipment itself continues to be a significant problem. Electrical equipment that overheats can malfunction and set fire, which is costly and dangerous.

Despite the progress made in the area of thermal and mechanical systems, there is a need in the art for improved methods and systems related to thermal and mechanical systems.

SUMMARY OF THE INVENTION

The present invention relates generally to cooling the inside of an enclosure. Heat exchanger assemblies and methods are provided for cooling the interior of an enclosure where heat is transferred via thermal conduction from a first plurality of surfaces positioned inside the enclosure to a second plurality of surfaces positioned outside the enclosure. The first and second plurality of surfaces remain in thermal contact with one another during use. Heat is dissipated from the second plurality of surfaces to the ambient air outside the isolated environment without the ambient outside air mixing together with the air inside the enclosure. This, in turn, inexpensively removes heat from the air inside the enclosure and prevents contaminants from entering the enclosure.

According to an embodiment of the present invention, a heat exchanger assembly operably transfers heat from inside air located inside a closed container to outside air located outside the closed container. The heat exchanger assembly comprises an interior thermal conductor. The interior thermal conductor comprises an interior core joined to an interior side of the closed container and a first plurality of surfaces. The first plurality of surfaces are joined to the interior core and the first plurality of surfaces are spaced apart from one another. An exterior thermal conductor comprises an exterior core joined to an exterior side of the closed container; and a second plurality of surfaces are joined to the exterior core. The second plurality of surfaces are spaced apart from one another. A thermal path is defined from the first plurality of surfaces to the second plurality of surfaces. It's important to note that the inside air does not mix with the outside air.

According to another embodiment of the present invention, a method of removing heat from an isolated environment comprises first providing an isolated environment. The environment contains a heat producing item and is configured to seal ambient air inside. A heat exchanger assembly is affixed to a partition of the isolated environment. The heat exchanger assembly comprises a first plurality of spaced, substantially parallel fins, and a second plurality of spaced, substantially parallel fins which are provided opposite the first plurality of fins such that the first plurality of fins are in thermal contact with the second plurality of fins across a solid substrate core. At least one first fan is operatively connected to the solid substrate core and the first plurality of fins. At least one second fan is operatively connected to the solid substrate core and the second plurality of fins. Power is supplied to the at least one first and second fans and the at least one first fan is used to push ambient air inside the isolated environment across the first plurality of fins. The at least one second fan is used to push ambient air outside the isolated environment across the second plurality of fins to allow conductive heat transfer from the first plurality of fins to the second plurality of fins to remove heat from the isolated environment during use without the air outside the isolated environment from mixing with the air inside the isolated environment. The ambient air inside the isolated environment is warmer than the ambient air outside the isolated environment.

According to yet another embodiment of the present invention, a heat exchanger assembly operably transfers heat from inside air located inside a closed container to outside air located outside the closed container. The heat exchanger assembly comprises an interior thermal conductor comprising a first plurality of surfaces joined to a first side of a central core. The first plurality of surfaces are spaced apart from one another. An exterior thermal conductor comprises a second plurality of surfaces joined to a second side of the central core and the second plurality of surfaces are spaced apart from one another. A thermal path is defined from the first plurality of surfaces to the second plurality of surfaces and the inside air does not mix with the outside air during use.

Numerous benefits are achieved by way of the present invention over conventional techniques to cool enclosures. For example, embodiments of the present invention provide effective, inexpensive, reliable, versatile, and efficient heat exchangers and methods for removing heat from isolated environments, including closed containers that resist performance degradation over time, have a long life span; operate over a wide temperature range, prevent contaminants from entering the enclosure, mitigates thermal gradients, and have a compact, lightweight design. Moreover, embodiments of the present invention provide cooling without using dangerous chemicals or cooling fluids that harm the environment. Furthermore, the heat exchanger can be used indoors or outdoors and can be scaled to the enclosure size. It can also be installed in a variety of locations and orientations.

DETAILED DESCRIPTION OF SPECIFIC EMBODIMENTS

Figure 1:
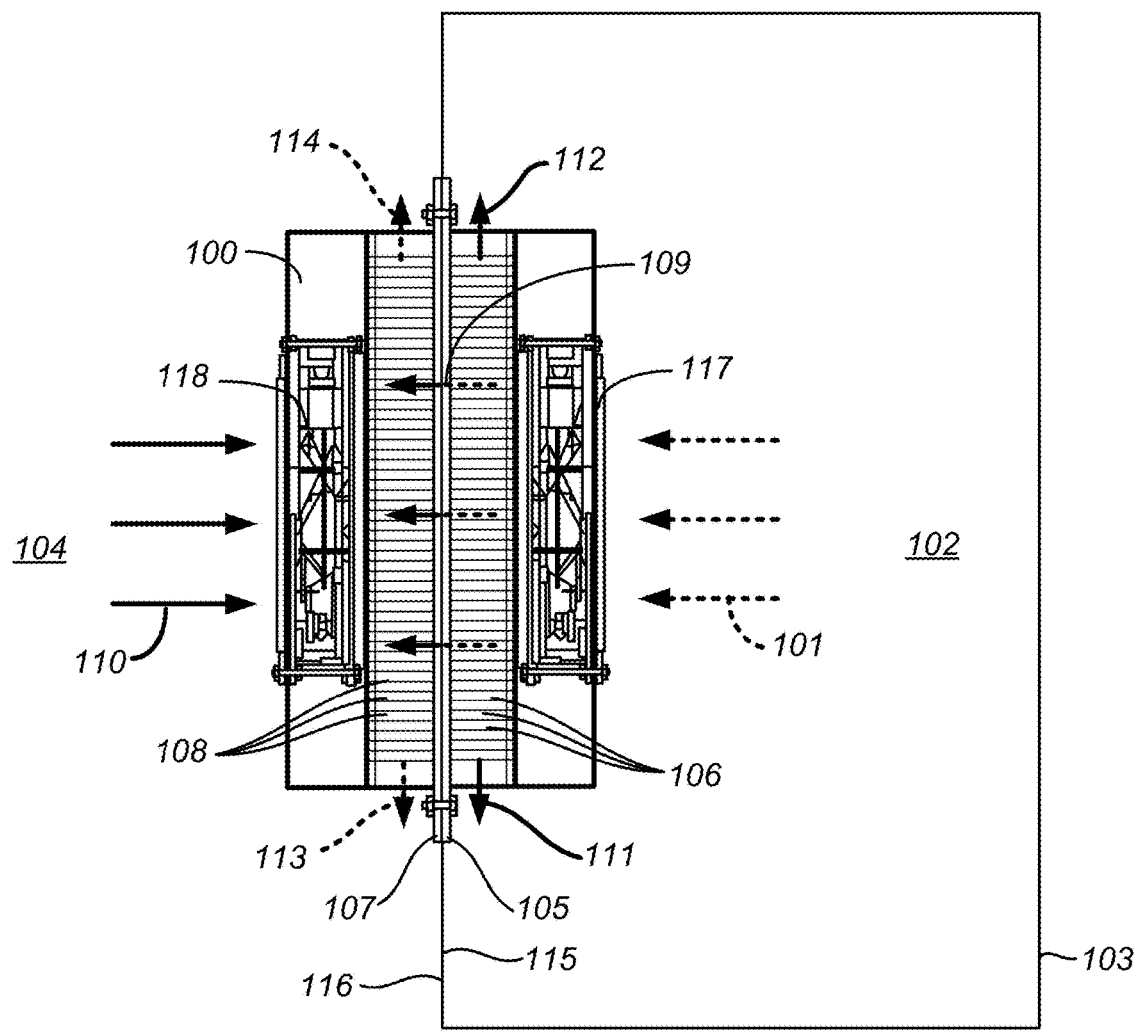
FIG. 1 is cross-sectional view of a heat exchanger assembly according to an embodiment of the present invention.

Certain embodiments of the invention effectively and efficiently facilitate cooling the interior of a substantially airtight enclosure using principles of thermal conduction. A plethora of scalable configurations and installation orientations of the heat exchanger assembly are contemplated to cool a variety of enclosure sizes. In some embodiments, the fins have spacing, height, and thickness sized to fit a performance curve of each of the connected fans. The fans may be connected to a programmable thermostat.

To avoid over-heating inside an enclosure, a wide variety of techniques are employed to maintain at least an ambient temperature within the enclosure. Historically, there are four common ways to remove heat from enclosures. These include natural convection, compressed air, heat pipes and air conditioners.

Natural convection relies on fans and filters and is inexpensive to operate; however, natural convection only works when the ambient air is cool and clean. If the air is not clean, the fan will introduce airborne contaminants into the enclosure. Unfortunately, most facilities and enclosures do not have an adequate supply of naturally cool and clean air. Therefore, natural convection is not commonly used to remove heat from enclosures.

Compressed air coolers use a small stream of air that passes through a cooler. A vortex is created to reduce the heat. They are capable of cooling below ambient temperatures; however, compressed air cooling is expensive. Additionally, lines tend to become blocked when compressed air coolers are used in harsh environments and they tend to introduce dust and other contaminants into enclosed spaces. They also tend to emit a small amount of oil mist from the lines into the enclosure. Without a source of compressed air, this method of cooling will not work.

Heat pipes have the potential to cool an enclosure at slightly above outside ambient air temperatures; however, the installation of heat pipe exchangers can be costly and is limited to very specific placement and orientation. They require fluids and tend to suffer from performance degradation and reliability issues over time.

Air conditioning to cool an enclosure is expensive and uses significant amounts of energy. Another drawback is that many air conditioners still use Freon®, a chlorofluorocarbon (CFC). The U.S. Environmental Protection Agency has declared chlorofluorocarbons to be potentially damaging to the ozone layer of the earth's atmosphere. Freon® may cause illness and the vapors can cause asphyxiation in confined spaces.

Information related to attempts to address these problems can be found in U.S. Pat. Nos. 4,706,739; 4,907,644; 5,297,005; 5,311,928; 5,406,451; 5,579,830; 5,748,445; 6,105,875; 6,131,647; 6,196,003; 6,301,779; 6,611,428; 7,342,789; 7,436,660; 7,650,932; 7,654,310; 7,957,132; and United States Patent Application Publication Numbers: 2011/0267776 A1 and 2015/0075184 A1; as well as the following publications: Dawn, K., *Reduce Electronic Waste Heat Without Breaking The Budget, IMPO* (April 2012) pp. 22-23; and Lienhard, J. H., et al., *A Heat Transfer Textbook*, Dover Civil and Mechanical Engineering, 4th Edition (2011) pp. 6-10, 99-129, 141-184, for example. Various types of systems, devices, assemblies and methods for removing heat from an isolated environment or associated technologies, including some embodiments of the subject invention, can mitigate or reduce the effect of, or even take advantage of, some or all of these potential problems and shortcomings.

For at least the foregoing reasons, there's a legitimate need for effective, inexpensive, reliable, versatile, and efficient heat exchangers and methods for removing heat from isolated environments, including closed containers, without the drawbacks previously described. It would be preferable that the heat exchanger also: 1) resists performance degradation over time; 2) has a long life span; 3) operates over a wide temperature range; 4) prevents introduction of contaminants into the enclosure; 5) mitigates thermal gradients (i.e., hot spots); 6) has a compact, lightweight design; 7) does not use dangerous chemicals or cooling fluids; 8) does not harm the environment; 9) can be used indoors or outdoors; 10) can be scaled to the enclosure size; and 11) installs easily in a wide variety of locations and orientations. Power savings and reduced operating costs would also be welcome advantages.

FIG. 1 is cross-sectional view of a heat exchanger assembly 100 according to an embodiment of the present invention. The heat exchanger assembly 100 transfers heat in direction 101 from relatively warm air 102 located inside a closed container 103 to relatively cooler air 104 located outside the closed container 103. The heat exchanger 100 assembly has an interior thermal conductor that includes an interior core 105 joined to an interior side 115 of the closed container and a first plurality of surfaces 106 joined to the interior core 105. The first plurality of surfaces 106 are spaced apart from one another. There is also an exterior thermal conductor that includes an exterior core 107 joined to an exterior side 116 of the closed container and a second plurality of surfaces 108 joined to the exterior core 107. Optionally, gaskets may be installed between the interior core 105 and the interior side 115 of the container and/or between the exterior core 107 and the exterior side 116 of the closed container 103 to seal the closed container such that no inside air 102 is mixed with outside air 104. Like the first plurality of surfaces 106, the second plurality of surfaces 108 are also spaced apart from one another. The first plurality of surfaces may have a darker color (e.g., a lower relative reflectance and/or increased heat absorption) relative to the color of the second plurality of surfaces. The second plurality of surfaces may have a relatively higher reflectance and/or decreased heat absorption. This color differential may enhance a thermal pathway between the surfaces. A thermal path 109 is defined from the first plurality of surfaces 106 to the second plurality of surfaces 108. The thermal path 109 includes an area of heat transfer by conduction. The inside air 102 does not mix with the outside air 104. Cooler air moves in directions 110, 111, 112 and relatively warmer air moves in directions 101, 113, 114.

According to some embodiments of the present invention, the interior core 105 and the exterior core 107 are positioned substantially opposite one another across the interior side 115 and exterior side 116 of the closed container 103. The first and/or second plurality of surfaces may be fins, pins, pegs, or any combination thereof. The first and/or second plurality of surfaces are configured to be attached to the interior and/or exterior cores in any combination of straight, flared, angled, offset, or random arrangement, for example. The heat exchanger assembly 100 further comprises at least one first fan operatively connected to the interior core. The at least one first fan is configured to move air across the first plurality of surfaces and at least one second fan is operatively connected to the exterior core. The at least one second fan is configured to move air across the second plurality of surfaces. Each of the first plurality of surfaces and the at least one first fan only contacts the inside air located inside the closed container while the second plurality of surfaces and the at least one second fan only contacts outside air located outside the closed container. The first plurality of surfaces may have a darker color relative to the color of the second plurality of surfaces.

Heat is transferred via thermal conduction from the first plurality of surfaces to the second plurality of surfaces during use to cool the inside air located inside the closed container and dissipate heat from the second plurality of surfaces to the outside air located outside the closed container. The heat exchanger assembly does not employ any fluids, coolants or refrigerants during use.

According to embodiments of the present invention, the closed container contains a heat generating item. For example, the heat generating item may include heat from electrical activity, mechanical activity, chemical activity, biological activity, radiant activity, or any combination thereof. The first plurality of surfaces and the second plurality of surfaces have a spacing, a height, and a thickness sized to fit a performance curve of each of the at least one first and second fans, respectively. The spacing may be between about 0.03 and 0.125 inches, the height is between about 0.5 and 2.5 inches, and the thickness is between about 0.001 and 0.1 inches, for example. The first and second plurality of surfaces may be made of aluminum, copper, steel, or alloys thereof. The assembly substantially mitigates temperature gradients inside the closed container.

According to embodiments of the present invention, at least one first and second fans may have the same capacity or they may have different capacities. The at least one first fan may have a capacity of about 150 cubic feet per minute and the at least one second fan may have a capacity of about 150 cubic feet per minute, for example. The first plurality of surfaces are about 0.04 inches thick and the second plurality of surfaces are about 0.04 inches thick. The first plurality of surfaces and the at least one first fan are capable of transferring at least 300 watts of heat from the (relatively warmer) inside air located inside the closed container to the outside air located outside the closed container when the inside air located inside the closed container is approximately 200 Celsius above the temperature of the outside air located outside the closed container. The heat exchanger assembly is configured to attach to the closed container in a variety of ways including vertical, horizontal, or diagonal orientations. The heat exchanger has a temperature rating between 1° Celsius and 70° Celsius and can operate effectively in both indoor and outdoor environments.

The interior core 105 and the exterior core 107 are positioned substantially opposite one another across the interior side 115 and exterior side 116 of the closed container 103 as shown in FIG. 1. Alternatively, the interior core 105 and exterior core 107 may be positioned offset from one another. Provided that at least some of the first and second plurality of surfaces define a thermal pathway across the surfaces, they may be offset to some degree. For example, the first 206 and second 208 plurality of surfaces are offset across a central core 205 in FIG. 2A. Alternatively, FIG. 2B shows the first 206 and second 208 plurality of surfaces positioned substantially opposite and in alignment with one another across the central core 205. Generally, the larger the thermal pathway, the greater the potential to remove heat.

Figure 2A:
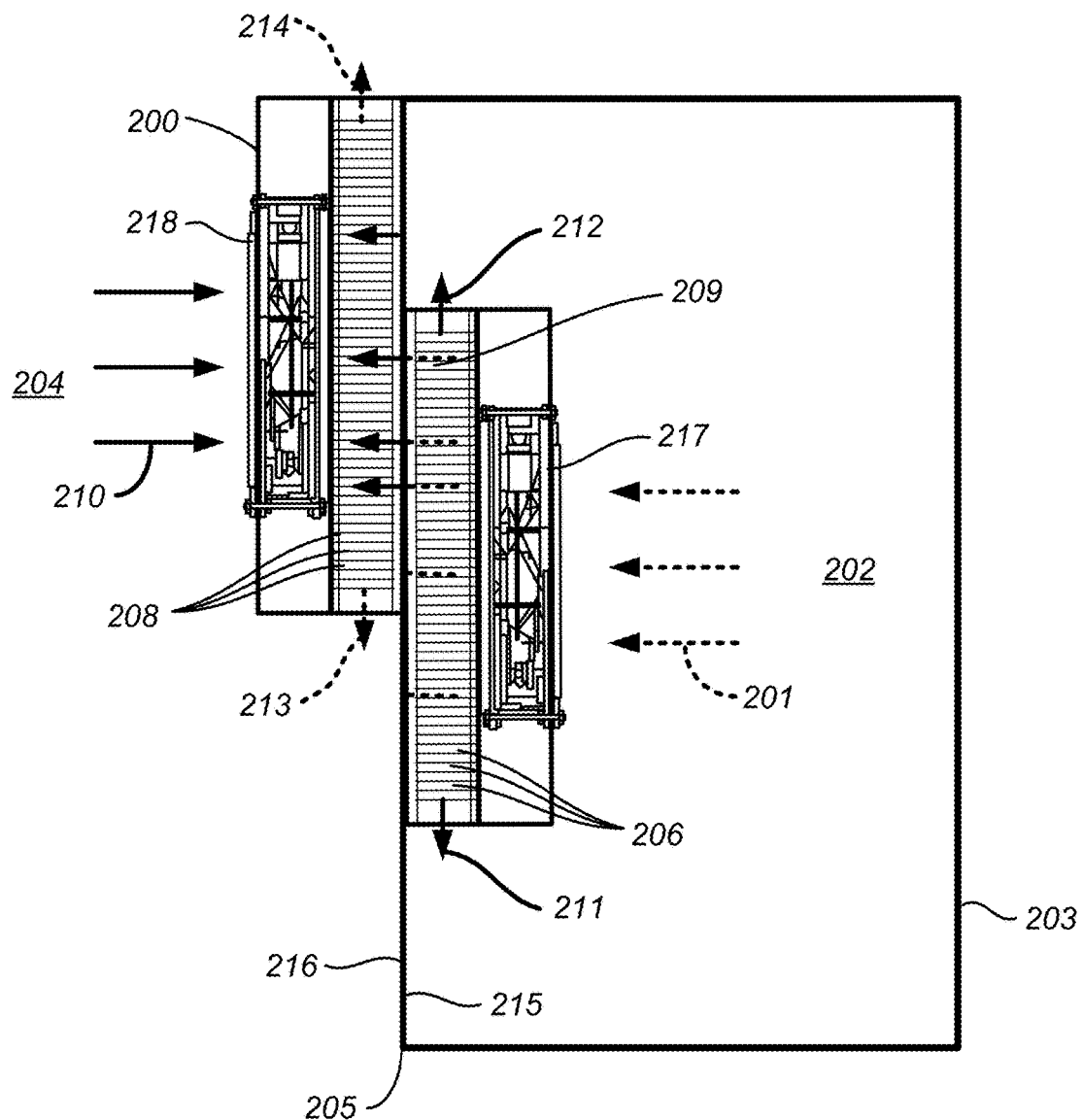
FIG. 2A is a cross-sectional view of a heat exchanger assembly according to another embodiment of the present invention.
Figure 2B:
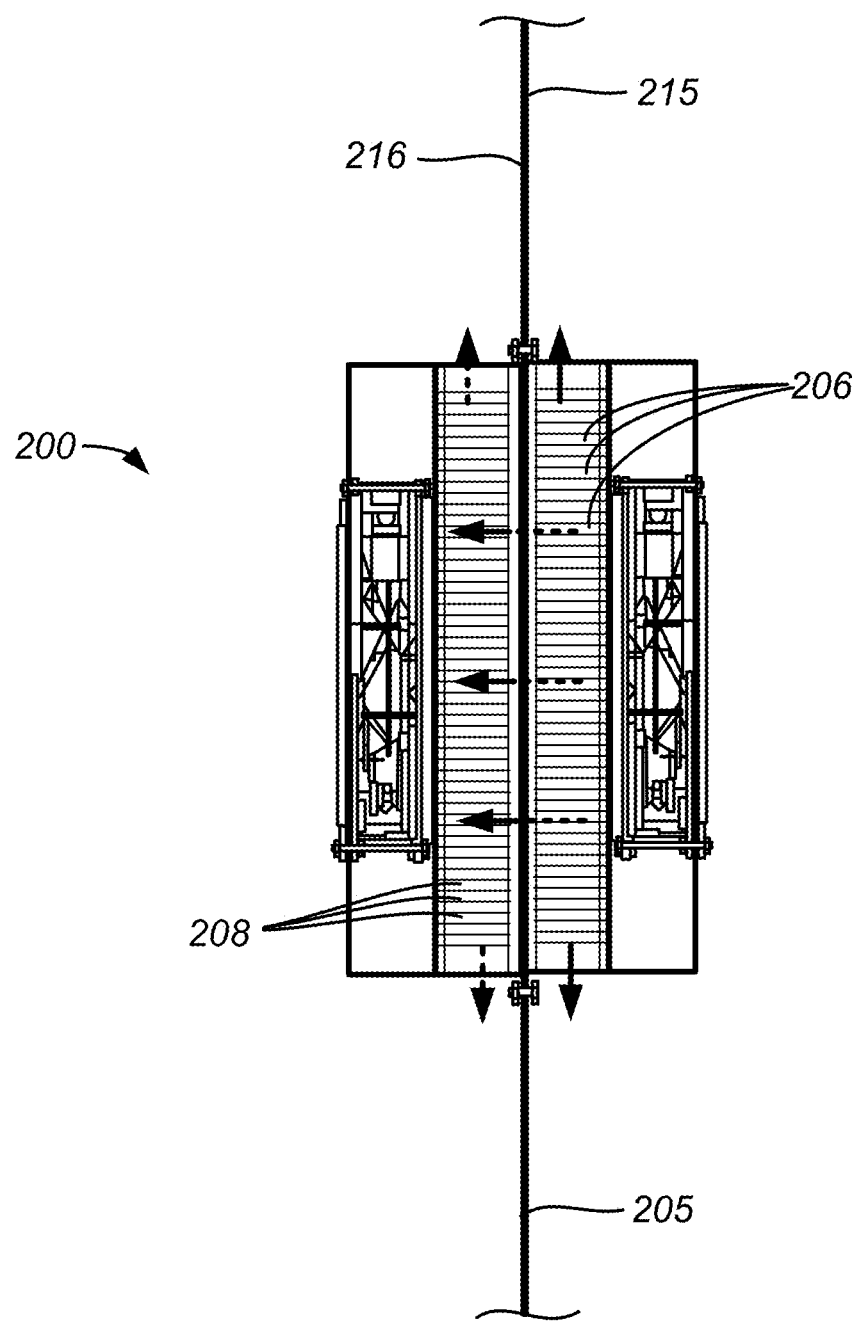
FIG. 2B is a cross-sectional view of a heat exchanger assembly according to another embodiment of the present invention.

As shown in FIG. 2A, a heat exchanger assembly 200 operates to transfer heat from inside air 202 located inside a closed container 203 to outside air 204 located outside the closed 203 container. The heat exchanger assembly 200 includes an interior thermal conductor comprising a first plurality of surfaces 206 joined to a first side 215 of a central core 205, wherein the first plurality of surfaces 206 are spaced apart from one another. An exterior thermal conductor comprises a second plurality of surfaces 208 joined to a second side 216 of the central core 205. The central core 205 may be a wall, door, or partition of the closed container 203, for example. The second plurality of surfaces 208 are spaced apart from one another. A thermal path 209 is defined from the first plurality of surfaces 206 to the second plurality of surfaces 208. Conductive heat transfer occurs across the thermal path 109, 209 per FIGS. 1 and 2A, respectively. The inside air 202 does not mix with the outside air 204 during use. This prevents particulates (e.g., dust, debris, foreign matter) from entering the closed container thus avoiding contaminating the items inside the closed container while keeping them relatively cool. Cooler air moves in directions 210, 211, 212 and relatively warmer air circulates in direction 201, 213, 214.

The heat exchanger system 100 may also be comprised of at least one first fan 117 operatively connected to the interior core 105 to move air 102 across the first plurality of surfaces 106 in direction 101. At least one second fan 118 is operatively connected to the exterior core 107 to move air 104 across the second plurality of surfaces 108 in direction 110. The mechanical movement of air via fan facilitates the conductive heat transfer across the thermal pathway and may add efficiency to the removal of heat, for example. Of course, more fans may be added/coupled to the heat exchanger system based on the size of the closed container, the amount of heat to be removed, the temperature gradient inside vs. outside the closed container, and many other factors. In any event, each of the first plurality of surfaces and the at least one first fan only contacts the inside air located inside the closed container and the second plurality of surfaces and the at least one second fan only contacts outside air located outside the closed container such that heat is transferred via thermal conduction from the first plurality of surfaces to the second plurality of surfaces during use. As relatively warm air moves in direction 101 across the first plurality of surfaces 106, the air is conductively cooled as heat moves across the thermal pathway 109. Relatively cooler air moves in directions 111 and 112. Heat is dissipated from the second plurality of surfaces 108 to the outside air 104 in directions 113 and 114. This process does not require the use of any fluids, coolants or refrigerants. No liquids are used. The location of the closed container may cause the inside air 102 to be relatively warmer that the outside air 104. In addition or alternative to radiant energy warming the inside of the container, the closed container may contain a heat generating item. This item could be electronics (e.g., computer or stereo equipment) or even an exothermic chemical reaction or warm blooded animal, for example. Therefore, the heat generating item may include heat from electrical activity, mechanical activity, chemical activity, biological activity, radiant activity, or any combination thereof. In some regards, the larger the temperature difference between the outside and the inside of the closed container, the more pronounced the potential heat removal. Even a small temperature difference allows the heat exchanger assembly to substantially mitigate temperature gradients inside the closed container.

The first plurality of surfaces 106 and the second plurality of surfaces 108 of the heat exchanger assembly 100 may be made of aluminum, copper, steel, or metal alloy and have a spacing, a height, and a thickness sized to fit a performance curve of each of the at least one first 117 and second 118 fans, respectively. The spacing is between about 0.03 and 0.125 inches, the height is between about 0.5 and 2.5 inches, and the thickness is between about 0.001 and 0.1 inches. The fans 217, 218 and surfaces 206, 208 shown in FIG. 2 may have a similar relationship as those described in relation to FIG. 1.

The at least one first and second fans may have the same capacity or different capacities. Usually, if fans are installed, they will have the same capacity on each side of the container. The number of fans may be scaled according to the number of surfaces, for example. In a preferred embodiment, the at least one first fan 117, 217 has a capacity of about 200 cubic feet per minute and the at least one second fan 118, 218 has a capacity of about 200 cubic feet per minute.

In another preferred embodiment, the first plurality of surfaces 106, 206 are about 0.04 inches thick and the second plurality of surfaces 108, 208 are about 0.04 inches thick. Of course, the thickness, material, spacing, shape, and configuration of the surfaces may vary depending on parameters of the specific cooling project at hand. Generally, the first plurality of surfaces 106, 206 and the at least one first fan 117, 217 are capable of transferring at least 300 watts of heat from relatively warmer inside air 102, 204 located inside the closed container 103, 203 to the outside air 104, 204 when the relatively warmer inside air 102, 202 is approximately 20° Celsius above the temperature of the outside air 104, 204.

Figure 3:
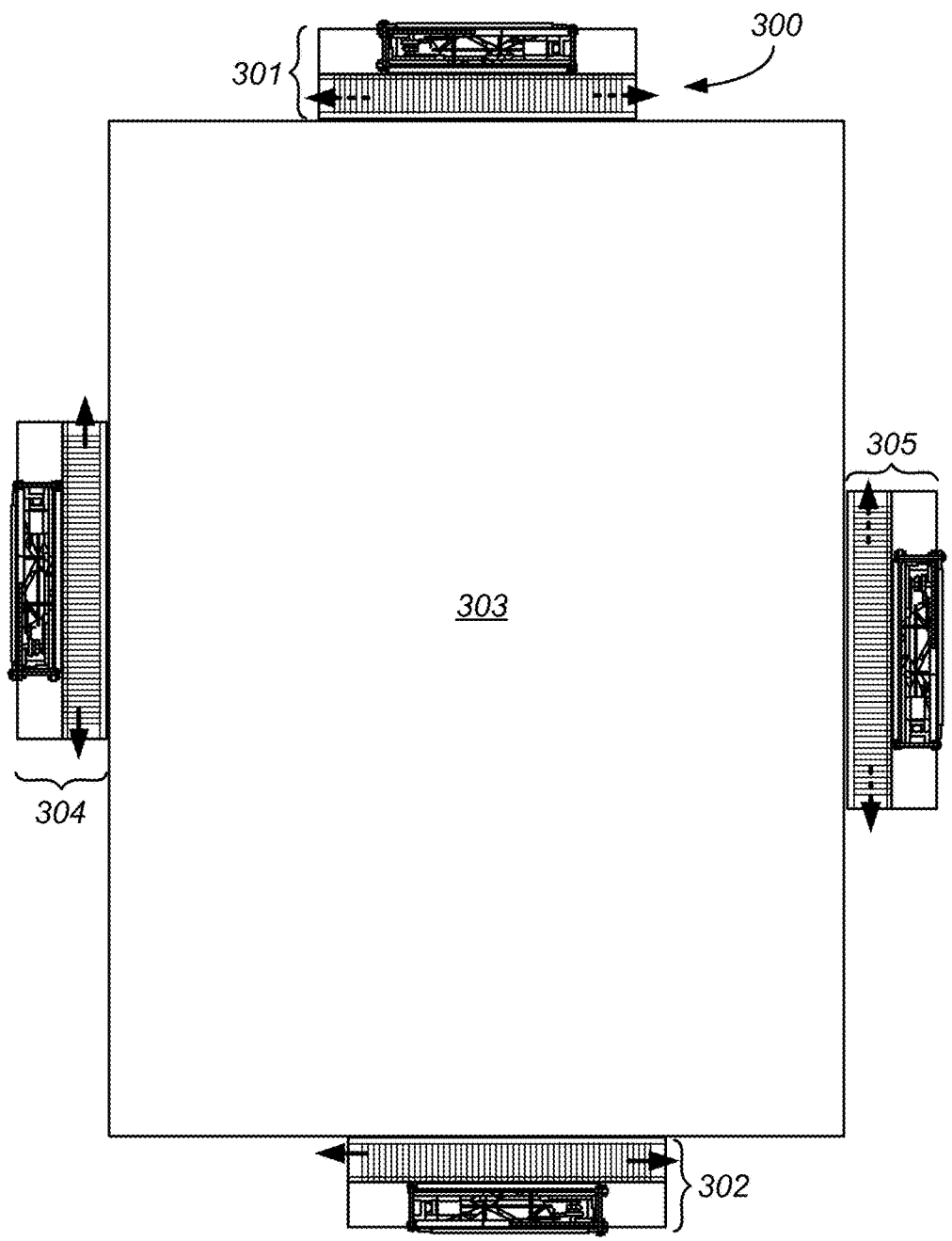
FIG. 3 is a front view of an enclosure showing heat exchanger assemblies installed in four different locations according to an embodiment of the present invention.
Figure 4:
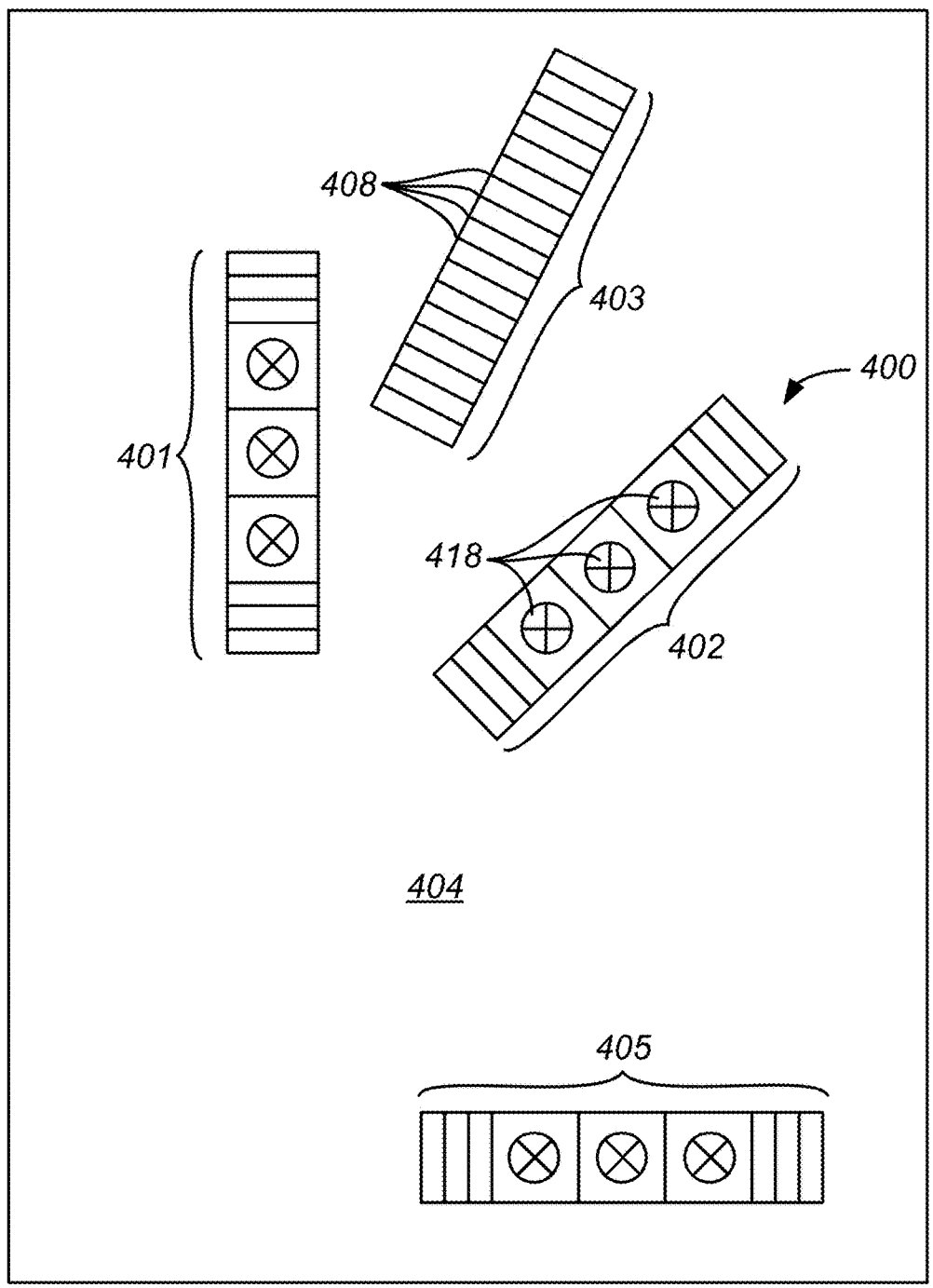
FIG. 4 is a view of an enclosure showing four heat exchanger assemblies installed at four different locations with different exemplary orientations according to embodiments of the present invention.

As shown in FIG. 3, the heat exchanger assembly 300 can be attached to the closed container 303 in a variety of locations. Top mount 301, side mounts 304, 305 and bottom mount 302 configurations are possible without degrading (or even affecting) the efficiency of the heat transfer. Since heat rises and heat dissipation inside a closed container is limited or non-existent, the top mount position can generally be expected to have the highest temperature differential (e.g., inside air temperature vs. outside air temperature). These various installation options are very convenient and allow flexibility for attaching the heat exchanger assembly 300 where space is limited, for example. Other types of cooling systems do not offer this advantage. In addition, the heat exchanger assembly can be attached to the closed container 404 in a variety of orientations including vertical 401, horizontal 405, or diagonal 402, 403 orientation as shown in FIG. 4. The heat exchanger assembly 400 may have fans (including 3 fans 418) or may not have any fans connected to the plurality of surfaces 408 as shown in the heat exchanger assembly mounted diagonally 403, for example. Regardless of the presence or number of fans, the heat exchanger has a temperature rating between about 1° Celsius and 70° Celsius and can operate effectively in both indoor and outdoor environments.

Figure 5:
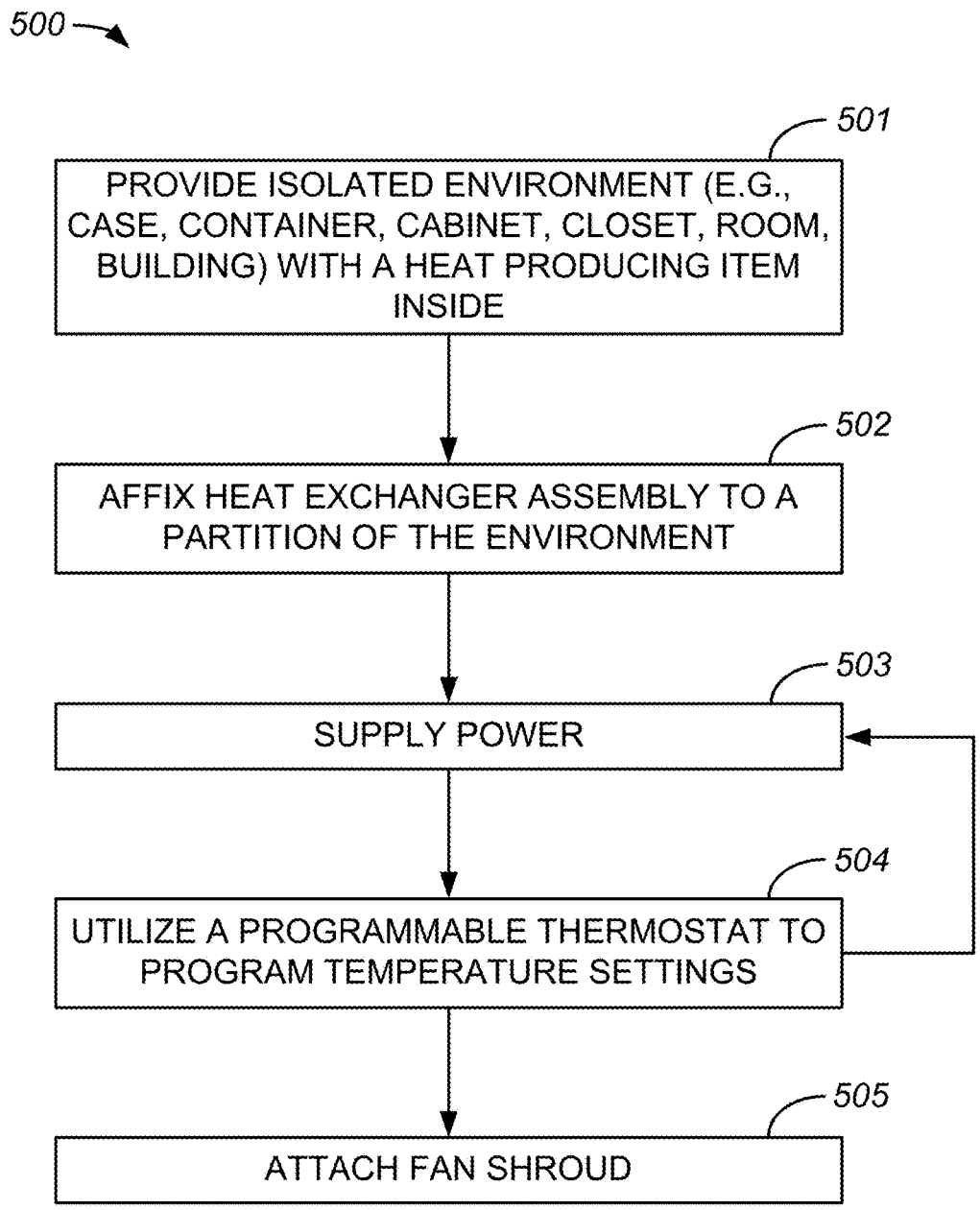
FIG. 5 is a flow diagram according to an embodiment of the present invention.

FIG. 5 shows a method of removing heat from an isolated environment according to an embodiment of the present invention. The method 500 comprises providing an isolated environment 501. The environment (e.g., a case, container, cabinet, closet, room, or building) contains a heat producing item and seals ambient air inside. A heat exchanger assembly is affixed to a partition of the isolated environment 502. The heat exchanger assembly comprises a first plurality of spaced, substantially parallel fins and a second plurality of spaced, substantially parallel fins positioned opposite the first plurality of fins such that the first plurality of fins are in thermal contact with the second plurality of fins across a solid substrate core. At least one first fan is connected to the solid substrate core and the first plurality of fins. At least one second fan is connected to the solid substrate core and the second plurality of fins. Power is supplied 503 to the at least one first and second fans. The first fan(s) push ambient air inside the isolated environment across the first plurality of fins and the second fan(s) push ambient air outside the isolated environment across the second plurality of fins. This facilitates conductive heat transfer from the first plurality of fins to the second plurality of fins. Thus, heat is removed from the isolated environment during use without the air outside the isolated environment from mixing with the (relatively warmer) air inside the isolated environment.

According to another alternative embodiment of the present invention, the method of removing heat from an isolated environment may further comprise utilizing a programmable thermostat that is operably attached to the heat exchanger assembly to power the at least first and/or second fans according to programmed temperature settings. The isolated environment may be a container, a case, a cabinet, a closet, a room or even an entire building. The heat exchanger assembly substantially reduces temperature gradients inside the isolated environment.

Optionally, a programmable thermostat may be employed 504. The thermostat is attached to the heat exchanger assembly to activate power to the at least first and/or second fans according to programmed temperature settings. The temperature settings can be pre-programmed or entered by a user in real time, for example. Remote temperature programming using a computer or smart phone via a wireless connection (e.g., Bluetooth® or Wi-Fi®) is contemplated. In this way, power is conserved and the temperature is closely regulated.

According to yet another alternative embodiment of the present invention, the method of removing heat from an isolated environment may further comprise attaching a fan shroud to each of the at least one first and second fans. The fan shrouds are configured to channel air over, between, and/or around the first and second plurality of fins, respectively. Optionally, the fan shroud may be attached 505 to each of the at least one first and second fans to channel air over, between, and/or around the first and second plurality of fins, respectively. The fan shroud may assist the heat exchanger assembly remove heat more efficiently. The heat exchanger assembly, particularly with the fans and fan shrouds, substantially reduces thermal gradients/hot spots inside the isolated environment as air is circulated in directions 101, 110 across the surfaces (e.g., fins) 106, 108 exiting in directions 111, 112 and 113, 114, respectively, in FIG. 1.

Figure 6A:
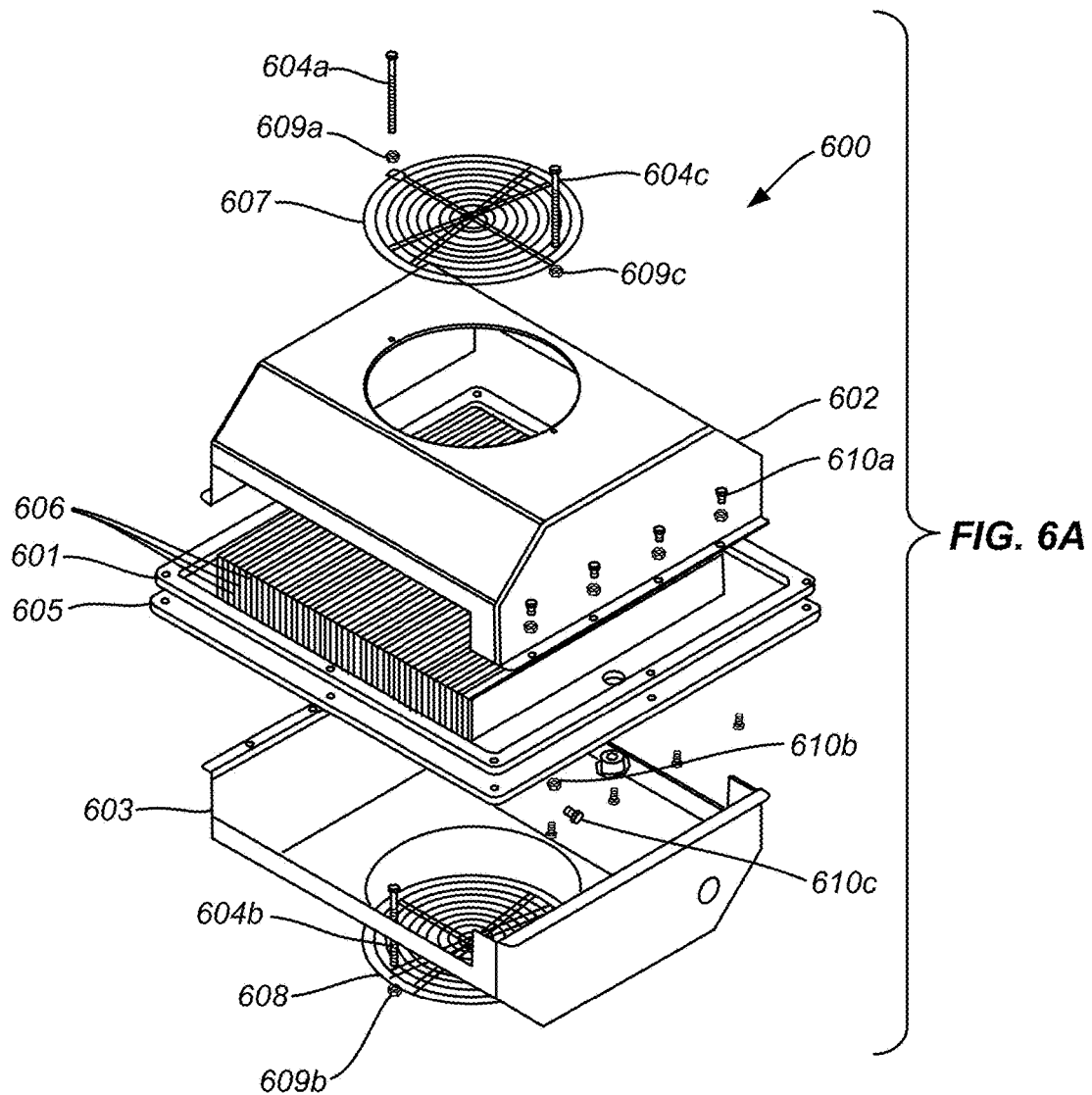
FIG. 6A is an exploded view of some components of the heat exchanger assembly according to an embodiment of the present invention.
Figure 6B:
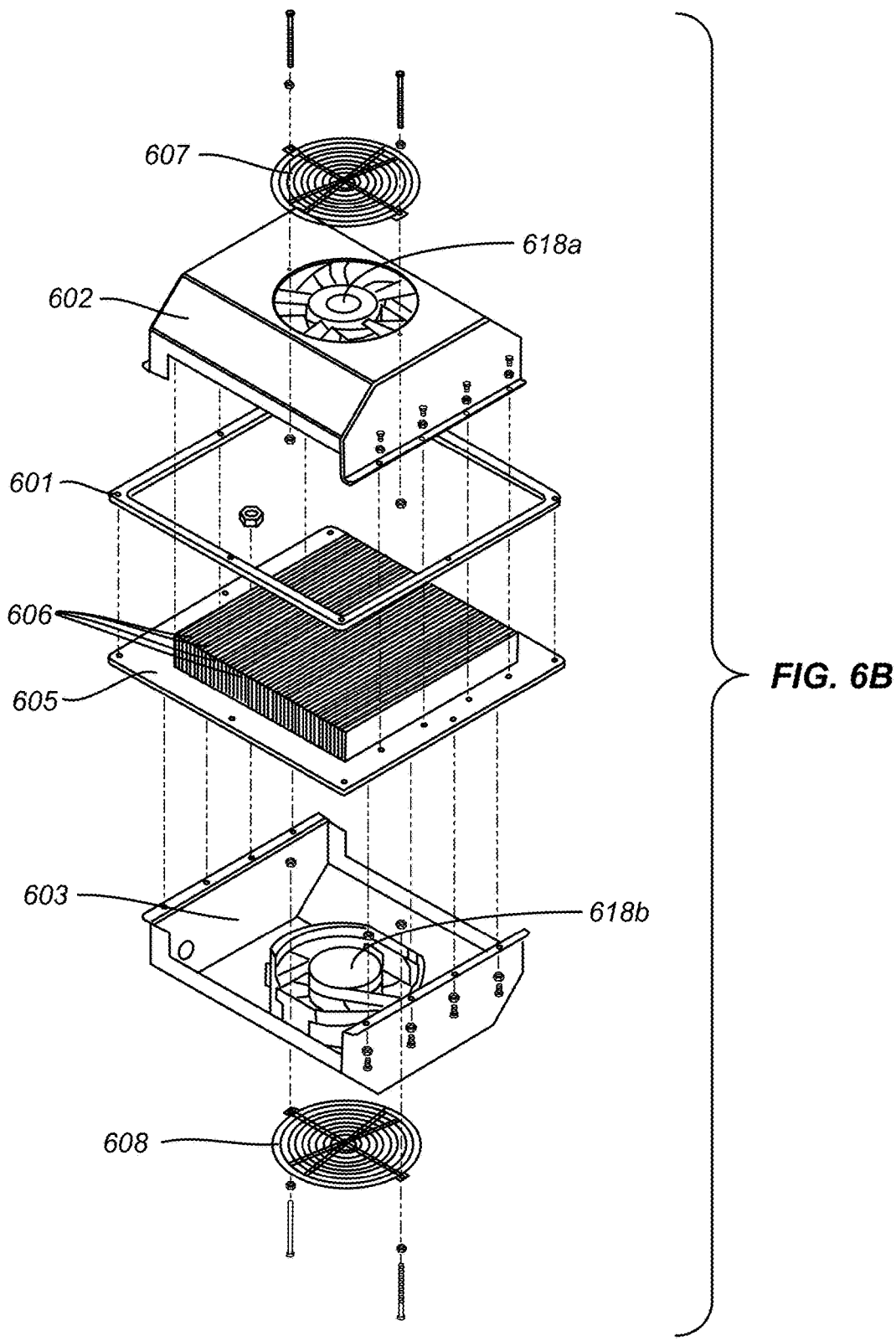
FIG. 6B is a view similar to FIG. 6A including the fans.

Referring now to FIG. 6, a heat exchanger assembly 600, minus the fans, is shown in a exploded view. A first plurality of surfaces 606 and/or a second plurality of surfaces (not shown) are disposed on an interior core 605 and an exterior core (not shown) in an arrangement similar to FIG. 1. Alternatively, the plurality of surfaces may be attached to a central core 205 per FIG. 2A-2B, for example. A gasket 601 may be used to seal the heat exchanger assembly 600 to a partition of the closed container. An internal 602 fan shroud and an external fan shroud 603 cover the first and second fans (not shown). The shroud protects the fan blades and directs air across the plurality of surfaces. Each fan shroud 602, 603 has a corresponding fan guard 607, 608 held to an opening in the shrouds with fasteners such as nuts 609a, 609b, 609c and bolts 604a, 604b, 604c, for example. The shrouds are connected to the core(s) 605 and optional gasket 601 with attachments 610a, 610b, 610c. FIG. 6B is similar to FIG. 6A. FIG. 6B includes the fans 618a, 618b surrounded by fan shrouds 602, 603, respectively. If fan(s) are not employed, the corresponding fan shroud(s) need not be installed.

Figure 7A:
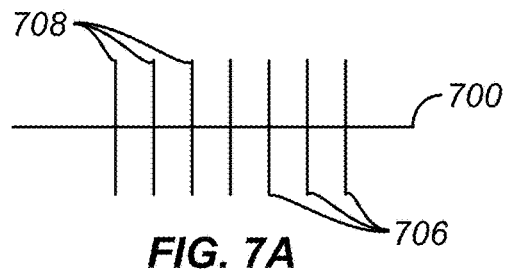
FIGS. 7A-7G is a diagram showing examples of a plurality of surface configurations according to other embodiments of the present invention.
Figure 7B:
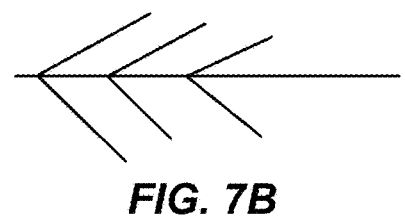
Figure 7C:
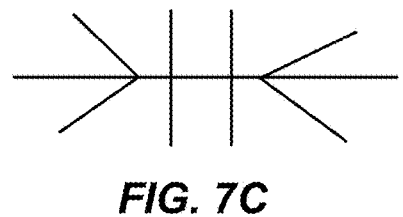
Figure 7D:
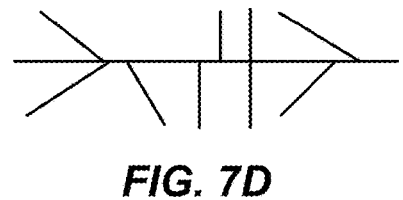
Figure 7E:
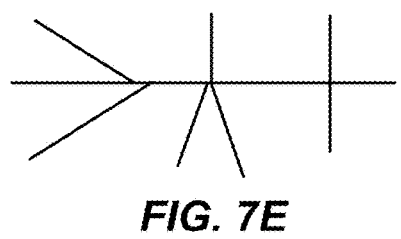
Figure 7F:
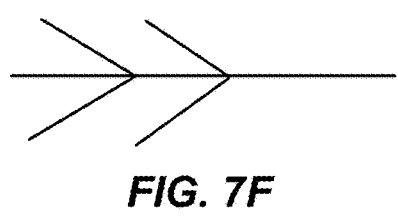
Figure 7G:
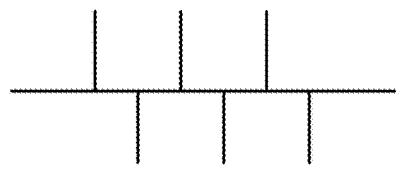

The first and/or second plurality of surfaces 106, 108 and 206, 208 shown in FIGS. 1 and 2, respectively, may be fins, pins, pegs, or any combination thereof. The first and/or second plurality of surfaces are configured to be attached to the core(s) 700 (e.g., interior and/or exterior cores 105, 107 or central core 205) in any combination. Preferably, a straight configuration as shown in FIG. 7A may be used; however, different variables and parameters may dictate or suggest alternative configurations. For example, configurations may be arranged as angled (FIGS. 7B and 7F), flared (FIG. 7C), offset (FIG. 7G), combo (FIG. 7E) or random (FIG. 7D). Of course, many other examples are contemplated and this disclosure is not limited to the examples shown in FIGS. 7A-7E.

Figure 8:
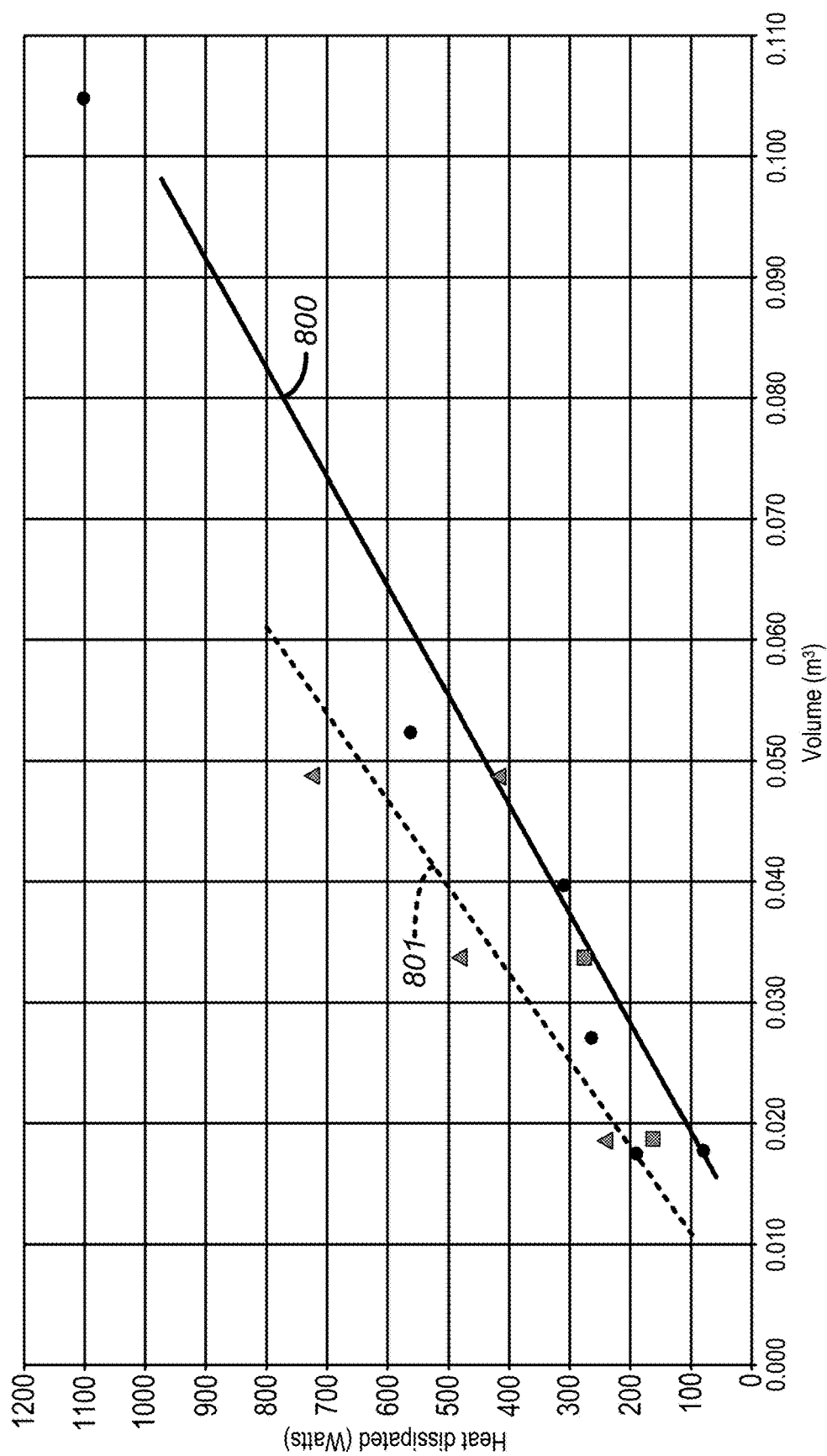
FIG. 8 is a graphical representation showing performance vs. size comparison of selected types of heat exchangers according to an embodiment of the present invention.

A graph comparing performance versus size of selected flush-mounted heat exchangers is shown in FIG. 8. Dissipated heat, expressed in watts, is represented along the y axis and volume, expressed in cubic meters, is tracked along the x axis. Current flush mount cooling units, such as heat pipes, are represented by circular data points and shown via extrapolated trend line 800. The heat exchanger assembly, including various embodiments of the subject invention, are represented by square and triangular data points. Specifically, the square data points represent low cost snapped fins (i.e., plurality of surfaces) while the triangular data points represent an extruded method of fin manufacture. Extrapolated trend line 801 summarizes snapped and extruded fins including embodiments of the present invention. Comparing the slopes of the extrapolated trend lines 800 and 801, it is clear that the heat exchanger assembly 801 dissipates heat relatively quickly given its size.

Figure 9:
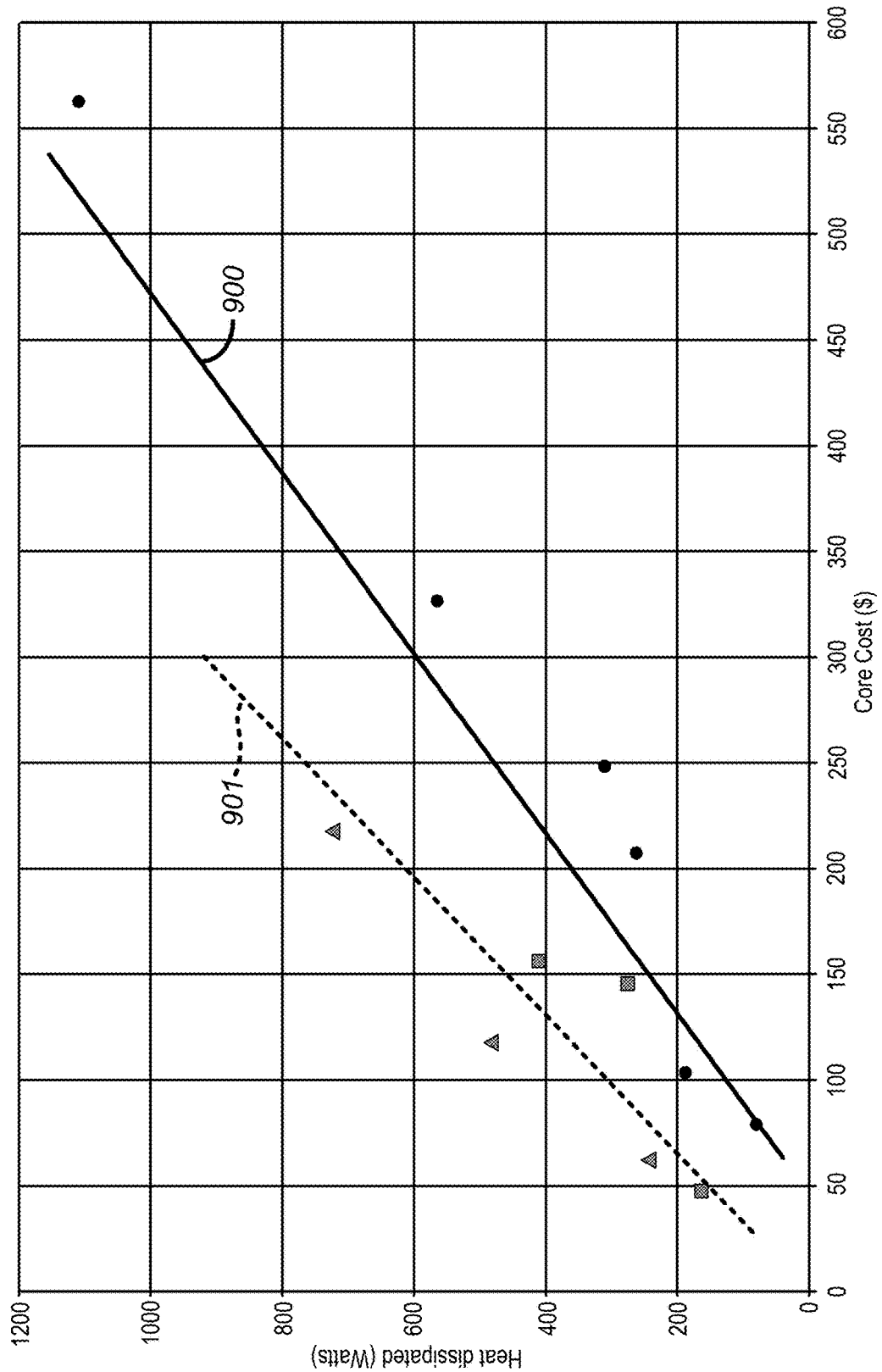
FIG. 9 is a graphical representation showing performance vs. cost comparison of selected types of heat exchangers according to an embodiment of the present invention.

FIG. 9 is a is a graphical representation showing performance versus monetary cost comparison of selected flush-mounted heat exchangers. Dissipated heat, expressed in watts, is represented along the y axis and cost, expressed in U.S. dollars, is tracked along the x axis. Current flush mount cooling units, such as heat pipes, are represented by circular data points and shown via extrapolated trend line 900. The heat exchanger assembly, including various embodiments of the subject invention, are represented by square and triangular data points. Similar to FIG. 8 described above, the square data points specify low cost snapped fins (i.e., plurality of surfaces) while the triangular data points represent an extruded method of fin manufacture. A system using extruded manufacturing techniques offers some advantages but it is generally more expensive. Extrapolated trend line 901 summarizes snapped and extruded fins including embodiments of the present invention. Comparing the slopes of the extrapolated trend lines 900 and 901, the heat exchanger assembly 901 (of which many embodiments are disclosed herein) works well to quickly dissipate heat and is much less expensive to manufacture. The simulation data depicted in FIGS. 8 and 9 quantitatively reflect the efficiency and cost effectiveness of some embodiments of the heat exchanger assembly disclosed herewith.

It is also understood that the examples and embodiments described herein are for illustrative purposes only and that various modifications or changes in light thereof will be suggested to persons skilled in the art and are to be included within the spirit and purview of this application and scope of the appended claims.

The previously described embodiments of the subject invention have many advantages, including an inexpensive, reliable, versatile, and efficient heat exchanger assembly and method that effectively removes heat from enclosures. Specific advantages include saves power, reduces, operating costs, resists performance degradation, increases life span, reduces introduction of contaminants, mitigates of hot spots, compact, lightweight design, eliminates dangerous chemicals or cooling fluids, environmentally safe, and easy installation in a wide variety of locations and orientations.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

As used in this specification, an "isolated environment" generally includes an "enclosure", "container", "cabinet", "cage", "closet", "room" or "building" that has a defined interior with a substantially airtight seal from the defined exterior.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

Although embodiments of the invention have been described in considerable detail with reference to certain preferred versions thereof, other embodiments are possible. Therefore, the spirit and scope of the appended claims should not be limited to the descriptions of the embodiments above.

What is claimed is:

1. A heat exchanger assembly configured to be attached to an external wall of a closed container and operable to transfer heat from inside air located inside the closed container, through the external wall, to outside air located outside the closed container, the heat exchanger assembly comprising:
    an interior subassembly configured to be joined to an interior side of the external wall, the interior subassembly comprising:
        an interior core configured to be joined to the interior side of the external wall; and
        a first plurality of surfaces joined to the interior core, wherein the first plurality of surfaces are spaced apart from one another;
    an exterior subassembly configured to be joined to an exterior side of the external wall, the exterior subassembly comprising:
        an exterior core configured to be joined to an exterior side of the external wall; and
        a second plurality of surfaces joined to the exterior core, wherein the second plurality of surfaces are spaced apart from one another;
    wherein a thermal path is defined from the first plurality of surfaces to the second plurality of surfaces, wherein the heat is transferred from the first plurality of surfaces to the second plurality of surfaces solely via conductive heat transfer, and wherein the inside air does not mix with the outside air.

2. The heat exchanger assembly of claim 1, wherein the closed container contains a heat generating item; and wherein the heat generating item generates heat from electrical activity, mechanical activity, chemical activity, biological activity, radiant activity, or any combination thereof.

3. The heat exchanger assembly of claim 1, wherein the interior core and the exterior core are positioned substantially opposite one another across the interior side and exterior side of the external wall.

4. The heat exchanger assembly of claim 1, wherein the first plurality of surfaces and/or the second plurality of surfaces comprise fins, pins, pegs, or any combination thereof.

5. The heat exchanger assembly of claim 1, wherein:
    the first plurality of surfaces is attached to the interior core in any combination of straight, flared, angled, offset, or random arrangement; and
    the second plurality of surfaces is attached to the exterior core in any combination of straight, flared, angled, offset, or random arrangement.

6. The heat exchanger assembly of claim 1, wherein the first plurality of surfaces are about 0.04 inches thick and the second plurality of surfaces are about 0.04 inches thick.

7. The heat exchanger assembly of claim 1, wherein the heat exchanger assembly is configured to attach to the external wall in a vertical, a horizontal, or a diagonal orientation.

8. The heat exchanger assembly of claim 1, wherein the heat exchanger has a temperature rating between 1° Celsius and 70° Celsius.

9. The heat exchanger assembly of claim 1, wherein the first plurality of surfaces and the second plurality of surfaces have a spacing, a height, and a thickness sized to fit a performance curve of each of at least one first and second fans, respectively.

10. The heat exchanger assembly of claim 9, wherein the spacing is between about 0.03 and 0.125 inches, the height is between about 0.5 and 2.5 inches, and the thickness is between about 0.001 and 0.10 inches.

11. The heat exchanger assembly of claim 1, further comprising:
    at least one first fan operatively connected to the interior core, the at least one first fan configured to move air across the first plurality of surfaces; and
    at least one second fan operatively connected to the exterior core, the at least one second fan configured to move air across the second plurality of surfaces.

12. The heat exchanger assembly of claim 11, wherein the first plurality of surfaces and the at least one first fan are capable of transferring at least 300 watts of heat from relatively warmer inside air located inside the closed container to the outside air located outside the closed container when the relatively warmer inside air located inside the closed container is approximately 20° Celsius above the temperature of the outside air located outside the closed container.

13. The heat exchanger assembly of claim 11, wherein the at least one first and second fans have the same capacity or wherein the at least one first and second fans have different capacities.

14. The heat exchanger assembly of claim 11, wherein the at least one first fan has a capacity of about 150 cubic feet per minute and the at least one second fan has a capacity of about 150 cubic feet per minute.

15. The heat exchanger assembly of claim 1, wherein the heat exchanger does not employ any fluids, coolants, and/or refrigerants.

16. The heat exchanger assembly of claim 1, further comprising an interior side gasket configured to be disposed between the interior core and the interior side of the external wall.

17. The heat exchanger assembly of claim 16, further comprising an exterior side gasket configured to be disposed between the exterior core and the exterior side of the external wall.

18. The heat exchanger assembly of claim 1, further comprising an exterior side gasket configured to be disposed between the exterior core and the exterior side of the external wall.

* * * * *